US011464114B2

(12) United States Patent
Kotler et al.

(10) Patent No.: US 11,464,114 B2
(45) Date of Patent: Oct. 4, 2022

(54) SYSTEM PRODUCING A CONDUCTIVE PATH ON A SUBSTRATE

(71) Applicant: Orbotech Ltd., Yavne (IL)

(72) Inventors: Zvi Kotler, Tel Aviv (IL); Michael Zenou, Hashmonaim (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 17/174,337

(22) Filed: Feb. 11, 2021

(65) Prior Publication Data

US 2021/0195756 A1 Jun. 24, 2021

Related U.S. Application Data

(62) Division of application No. 16/689,262, filed on Nov. 20, 2019, now abandoned, which is a division of
(Continued)

(51) Int. Cl.
*B23P 19/00* (2006.01)
*H05K 3/02* (2006.01)
(Continued)

(52) U.S. Cl.
CPC ............. *H05K 3/027* (2013.01); *H05K 1/097* (2013.01); *H05K 3/1283* (2013.01); *H05K 3/225* (2013.01); *H05K 3/26* (2013.01); *H05K 1/095* (2013.01); *H05K 3/0008* (2013.01); *H05K 3/125* (2013.01); *H05K 3/1241* (2013.01);
(Continued)

(58) Field of Classification Search
CPC ....... H01L 2224/73265; H01L 2224/03; H01L 2224/11; H01L 24/11; C09D 11/52; Y10T 428/12014; Y10T 29/532; Y10T 29/49156; H05K 2203/1105; B41M 7/009;
(Continued)

(56) References Cited

U.S. PATENT DOCUMENTS 5,164,565 A 11/1992 Addiego et al.
5,171,709 A 12/1992 Donelon et al.
(Continued)

FOREIGN PATENT DOCUMENTS

CN 102034683 B 4/2011
JP 3761615 B2 3/2006
(Continued)

OTHER PUBLICATIONS

WIPO, International Search Report for PCT/IL2014/000035, dated Oct. 6, 2014.
(Continued)

*Primary Examiner* — Thiem D Phan
(74) *Attorney, Agent, or Firm* — Hodgson Russ LLP

(57) ABSTRACT

A method of producing a conductive path on a substrate including depositing on the substrate a layer of material having a thickness in the range of 0.1 to 5 microns, including metal particles having a diameter in the range of 10 to 100 nanometers, employing a patterning laser beam to selectably sinter regions of the layer of material, thereby causing the metal particles to together define a conductor at sintered regions and employing an ablating laser beam, below a threshold at which the sintered regions would be ablated, to ablate portions of the layer of material other than at the sintered regions.

9 Claims, 6 Drawing Sheets

Related U.S. Application Data application No. 13/958,043, filed on Aug. 2, 2013, now Pat. No. 10,537,027.

(51) Int. Cl.
*H05K 1/09* (2006.01)
*H05K 3/26* (2006.01)
*H05K 3/22* (2006.01)
*H05K 3/12* (2006.01)
*H05K 3/00* (2006.01)

(52) U.S. Cl.
CPC .............. *H05K 2201/026* (2013.01); *H05K 2201/0323* (2013.01); *H05K 2203/081* (2013.01); *H05K 2203/108* (2013.01); *H05K 2203/173* (2013.01); *Y10T 29/49156* (2015.01); *Y10T 29/49163* (2015.01); *Y10T 29/532* (2015.01); *Y10T 29/53243* (2015.01)

(58) Field of Classification Search
CPC ..... C23C 18/06; C23C 18/08; C23C 18/1667; C23C 18/1692
USPC ........ 29/745, 705, 720, 755, 787, 33 F, 847, 29/402.01, 402.18, 846, 857
See application file for complete search history.

(56) References Cited

U.S. PATENT DOCUMENTS

| | | | | |
|---|---|---|---|---|
| 6,251,488 B1 * | 6/2001 | Miller | ............... | H01L 21/32131 |
| | | | | 427/596 |
| 8,404,160 B2 * | 3/2013 | Li | .......................... | H01B 1/026 |
| | | | | 252/519.33 |
| 2001/0006722 A1 | 7/2001 | Sakai et al. | | |
| 2005/0276933 A1 | 12/2005 | Prasad et al. | | |
| 2011/0278269 A1 | 11/2011 | Gold et al. | | |

FOREIGN PATENT DOCUMENTS

| | | |
|---|---|---|
| TW | 531687 B | 5/2003 |
| WO | 0072222 A1 | 11/2000 |
| WO | 2007134300 A1 | 11/2007 |

OTHER PUBLICATIONS

SIPO, English Translation of Office Action for CN Application No. 201480035678.1, dated Mar. 5, 2018.

SIPO, English Translation of Office Action for CN Application No. 201480035678.1, dated May 21, 2020.

\* cited by examiner

SYSTEM PRODUCING A CONDUCTIVE PATH ON A SUBSTRATE

CROSS-REFERENCE TO RELATED APPLICATIONS

This application is a divisional of U.S. patent application Ser. No. 16/689,262 filed on Nov. 20, 2019, which is a divisional of U.S. patent application Ser. No. 13/958,043 filed on Oct. 2, 2013, the contents of which are incorporated herein by reference in their entirety.

FIELD OF THE INVENTION

The present invention relates to electrical circuit manufacturing and repair generally.

BACKGROUND OF THE INVENTION

There are many known techniques for producing and repairing conductive paths on substrates.

SUMMARY OF THE INVENTION

The present invention seeks to provide an improved method of producing a conductive path on a substrate.

There is thus provided in accordance with a preferred embodiment of the present invention a method of producing a conductive path on a substrate including depositing on the substrate a layer of material having a thickness in the range of 0.1 to 5 microns, including metal particles having a diameter in the range of 10 to 100 nanometers, employing a patterning laser beam to selectably sinter regions of the layer of material, thereby causing the metal particles to together define a conductor at sintered regions and employing an ablating laser beam, below a threshold at which the sintered regions would be ablated, to ablate portions of the layer of material other than at the sintered regions.

Preferably, the depositing includes depositing using the ablating laser beam.

In accordance with a preferred embodiment of the present invention the layer of material includes conductive ink. Additionally, the method of producing a conductive path on a substrate also includes drying the conductive ink prior to the employing a patterning laser beam and the employing an ablating laser beam.

In accordance with a preferred embodiment of the present invention the patterning laser beam is a continuous laser beam and has a power level between 40-100 mW. Preferably, the ablating laser beam is a pulsed laser beam and has a fluence level between 1 and 500 miliJoule/cm$^2$. More preferably, the ablating laser beam is a pulsed laser beam and has a fluence level between 30 and 100 miliJoule/cm$^2$.

In accordance with a preferred embodiment of the present invention the ablating laser beam is operative to ablate portions of the layer of material other than at the sintered regions without damaging other components on the substrate.

Preferably, the employing a patterning laser beam is performed prior to the employing an ablating laser beam. Alternatively, the employing an ablating laser beam is performed prior to the employing a patterning laser beam.

In accordance with a preferred embodiment of the present invention the method of producing a conductive path on a substrate also includes, prior to the depositing, defining at least two areas on the substrate forming part of the conductive path and employing an ablating laser beam to ablate portions of a non-conductive layer formed over the substrate in the at least two areas.

There is also provided in accordance with another preferred embodiment of the present invention a method of producing a conductive path on a substrate including depositing on the substrate a layer of material having a thickness in the range of 0.1 to 5 microns, including metal particles having a diameter in the range of 10 to 100 nanometers, employing a patterning laser beam to selectably sinter regions of the layer of material, thereby causing the metal particles to together define a conductor at sintered regions and removing portions of the layer of material other than at the sintered regions.

Preferably, the depositing includes depositing employing a second laser beam.

In accordance with a preferred embodiment of the present invention the layer of material includes conductive ink. Additionally, the method of producing a conductive path on a substrate also includes drying the conductive ink prior to the employing a patterning laser beam.

Preferably, the patterning laser beam is a continuous laser beam and has a power level between 40-100 mW:

In accordance with a preferred embodiment of the present invention the removing includes removing portions of the layer of material other than at the sintered regions without damaging other components on the substrate.

Preferably, the method of producing a conductive path on a substrate also includes, prior to the depositing, defining at least two areas on the substrate forming part of the conductive path and employing an ablating laser beam, to ablate portions of a non-conductive layer formed over the substrate in the at least two areas.

There is further provided in accordance with yet another preferred embodiment of the present invention a system for producing a conductive path on a substrate including an optical assembly including a patterning laser, operative to generate a patterning laser beam and an ablating laser, operative to generate an ablating laser beam and a substrate positioning assembly, movable relative to the optical assembly, operative to position the optical assembly relative to a substrate, the patterning laser beam being operative to selectably sinter regions of a layer of material having a thickness in the range of 0.1 to 5 microns, including metal particles having a diameter in the range of 10 to 100 nanometers, deposited on the substrate, thereby causing the metal particles to together define a conductor at sintered regions and the ablating laser beam, being operative, below a threshold at which the sintered regions would be ablated, to ablate portions of the layer of material other than at the sintered regions.

Preferably, the substrate positioning assembly is moveable in both x and y directions relative to the optical assembly.

In accordance with a preferred embodiment of the present invention the patterning laser is a continuous wave laser. Additionally or alternatively, the ablating laser is a pulsed laser.

Preferably, the system for producing a conductive path on a substrate also includes a blower.

BRIEF DESCRIPTION OF THE DRAWINGS

The present invention will be understood and appreciated from the following detailed description taken together with the drawings in which.

DETAILED DESCRIPTION OF PREFERRED EMBODIMENTS

Figure 1A:
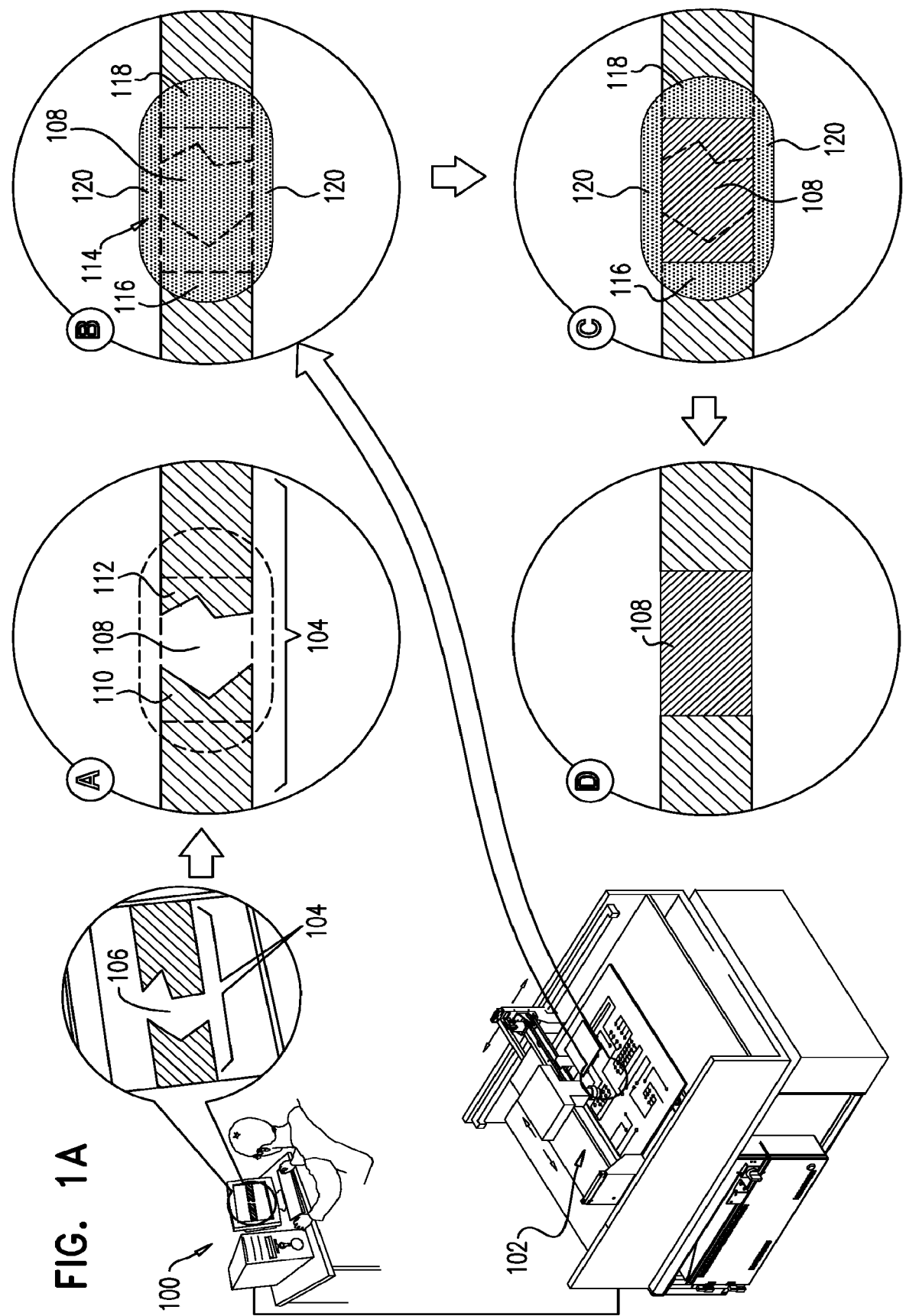
FIG. 1A is a simplified illustration of the operation of a system and method for producing a conductive path on a substrate in accordance with a preferred embodiment of the present invention.

Reference is now made to FIG. 1A, which is a simplified illustration of the operation of a system and method for producing a conductive path on a substrate in accordance with a preferred embodiment of the present invention. As seen in FIG. 1A, a visual inspection is carried out by an operator using a workstation 100, coupled to a conductive path generator 102, which will be described hereinbelow with respect to FIG. 4.

The operator typically sees a portion of a conductive path 104 having a cut 106 therein and indicates a designated repair region 108, as seen in enlargement A, which may be drawn automatically by the workstation 100 or manually by the operator using the workstation 100. Designated repair region 108 preferably not only includes the cut 106 but also adjacent regions 110 and 112 of the conductive path 104.

As seen in enlargement B, a conductive ink, such as a nanoparticle silver ink, a nanoparticle copper ink, or a non-metal conductive ink, for example, a carbon nanotube ink, is deposited over a region 114, extending beyond the designated repair region 108 and also covering adjacent regions 116 and 118 of the conductive path 104 and regions 120 alongside the conductive path being repaired. The deposition of the conductive ink is preferably carried out by using a laser beam which impinges on a donor substrate, typically a transparent donor substrate, coated with the conductive ink. The laser beam is typically produced by a short pulse, nanosecond pulsed laser with emission in the UV, Visible or NIR range, such as a microchip laser commercially available from Teem Photonics, Meylan, France. Alternatively, the conductive ink is deposited onto the repair location using an inkjet printer head or a dispensing tool for deposition of such ink locally on a substrate. The conductive ink is then dried, preferably by use of a suitable blower or by laser heating thereof.

Nanoparticle silver inks are commercially available from Sun Chemical Corp., Parsippany, N.J., USA, E.I. Du Pont De Nemours and Co., Wilmington, Del., USA, Amepox Microelectronics Ltd. of Lodz, Poland, Kunshan Hisense Electronics Co, Ltd of Jiangsu Province, China, and PV Nano Cell, Ltd. of Migdal Ha'Emek, Israel. Nanoparticle copper ink is commercially available from Intrinsiq Materials Inc. of Rochester, N.Y., USA. Carbon nanotube inks are commercially available from Brewer Science of Rolla, Mo., USA.

Preferably, the deposited layer has a thickness in the range of 0.1 to 5 microns and includes conductive particles having a diameter in the range of 10-100 nanometers.

As seen in enlargement C, laser sintering is preferably carried out in the designated repair region 108 and as seen in enlargement D, laser trimming is preferably carried out along the periphery thereof, thus removing unsintered conductive ink from regions 116, 118 and 120. Preferably, but not necessarily, laser trimming may be carried out using the same laser employed for deposit of the conductive ink.

It is a particular feature of the present invention that laser trimming and removal of unsintered conductive ink from regions 116 and 118 overlying the conductive path 104 is achieved without damaging the conductive path by the use of a pulsed laser at a pulse length of between 10 psec to 100 nsec and more particularly between 100 psec and 10 nsec and a pulse energy fluence of between 1 to 500 miliJoule/$cm^2$, and more particularly between 30 to 100 miliJoule/$cm^2$.

Figure 1B:
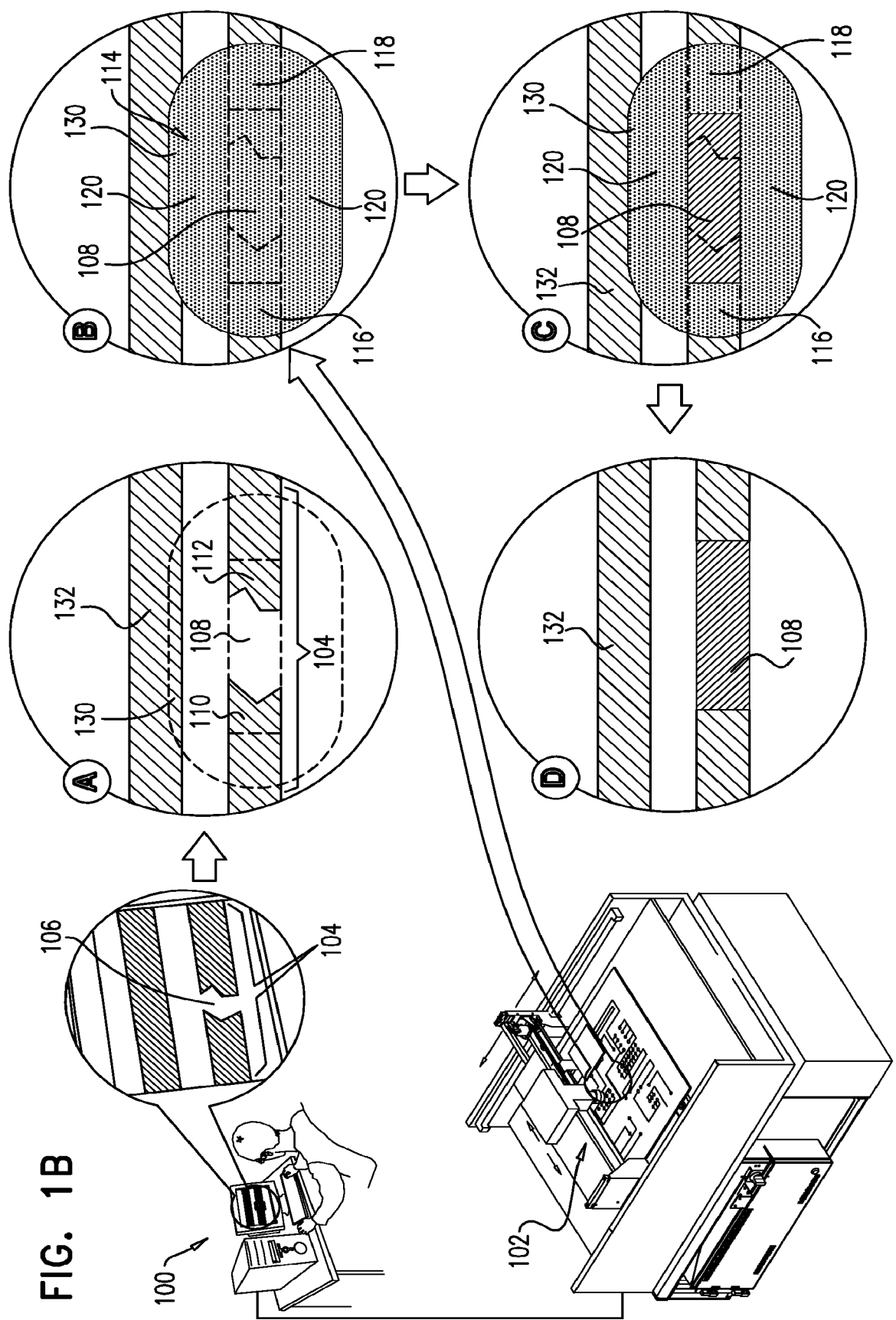
FIG. 1B is a simplified illustration of the operation of a system and method for producing a conductive path on a substrate in accordance with a preferred embodiment of the present invention, illustrating one particular feature of the embodiment.

Reference is now made to FIG. 1B, which is a simplified illustration of the operation of a system and method for producing a conductive path on a substrate in accordance with a preferred embodiment of the present invention, illustrating one particular feature of this embodiment.

As seen in FIG. 1B, a visual inspection is carried out by an operator using a workstation 100, coupled to a conductive path generator 102, which will be described hereinbelow with respect to FIG. 4.

The operator typically sees a portion of a conductive path 104 having a cut 106 therein and indicates a designated repair region 108, as seen in enlargement A, which may be drawn automatically by the workstation 100 or manually by the operator using the workstation 100. Designated repair region 108 preferably not only includes cut 106 but also adjacent regions 110 and 112 of the conductive path 104.

As seen in enlargement B, a conductive ink, such as a nanoparticle silver ink, a nanoparticle copper ink, or a non-metal conductive ink, for example, a carbon nanotube ink, is deposited over a region 114, extending beyond the designated repair region 108 and also covering adjacent regions 116 and 118 of the conductive path 104 and regions 120 alongside the conductive path being repaired as well as a region 130, which covers part of an adjacent conductive path 132. The deposition of the conductive ink is preferably carried out by using a laser beam which impinges on a donor substrate, typically a transparent donor substrate, coated with the conductive ink. The laser beam is typically produced by a short pulse, nanosecond pulsed laser with emission in the UV, Visible or NIR range, such as a microchip laser commercially available from Teem Photonics, Meylan, France. Alternatively, the conductive ink is deposited onto the repair location using an inkjet printer head or a dispensing tool for deposition of such ink locally on a substrate. The conductive ink is then dried, preferably by use of a suitable blower or by laser heating thereof.

Nanoparticle silver inks are commercially available from Sun Chemical Corp., Parsippany, N.J., USA, E.I. Du Pont De Nemours and Co., Wilmington, Del., USA, Amepox Microelectronics Ltd. of Lodz, Poland, Kunshan Hisense Electronics Co, Ltd of Jiangsu Province, China, and PV Nano Cell, Ltd. of Migdal Ha'Emek, Israel. Nanoparticle copper ink is commercially available from Intrinsiq Materials Inc. of Rochester, N.Y., USA. Carbon nanotube inks are commercially available from Brewer Science of Rolla, Mo., USA.

Preferably, the deposited layer has a thickness in the range of 0.1 to 5 microns and includes conductive particles having a diameter in the range of 10-100 nanometers.

As seen in enlargement C, laser sintering is preferably carried out in the designated repair region 108 and as seen in enlargement D, laser trimming is preferably carried out along the periphery thereof, thus removing unsintered conductive ink from regions 116, 118, 120 and 130. Preferably, but not necessarily, laser trimming may be carried out using the same laser employed for deposit of the conductive ink.

It is a particular feature of the present invention that laser trimming and removal of unsintered conductive ink from regions 116 and 118 overlying the conductive path 104 and from region 130 overlying part of adjacent conductive path 132 is achieved without damaging the conductive paths or other circuit elements, such as silicon-based transistors, capacitors and resistors and transparent conductors, by the use of a pulsed laser at a pulse length of between 10 psec to 100 nsec and more particularly between 100 psec and 10 nsec and a pulse energy fluence of between 1 to 500 miliJoule/cm$^2$, and more particularly between 30 to 100 miliJoule/cm$^2$. This is particularly important in cases where adjacent conductive paths and circuit elements are particularly close together in the micron range.

Figure 2:
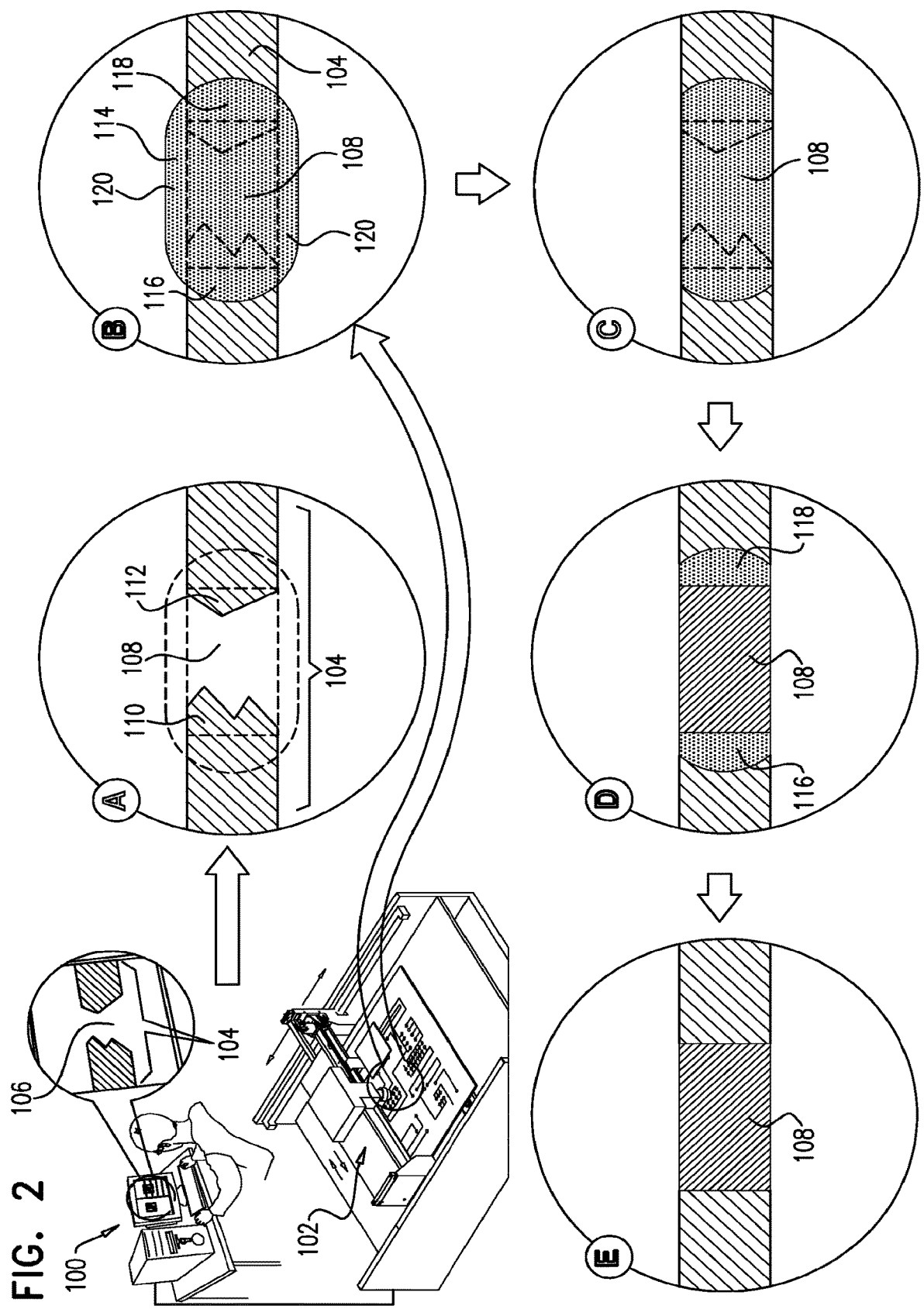
FIG. 2 is a simplified illustration of the operation of a system and method for producing a conductive path on a substrate in accordance with another preferred embodiment of the present invention.

Reference is now made to FIG. 2, which is a simplified illustration of the operation of a system and method for producing a conductive path on a substrate in accordance with another preferred embodiment of the present invention, As seen in FIG. 2, a visual inspection is carried out by an operator using a workstation 100, coupled to a conductive path generator 102, which will be described hereinbelow with respect to FIG. 4.

The operator typically sees a portion of a conductive path 104 having a cut 106 therein and indicates a designated repair region 108, as seen in enlargement A, which may be drawn automatically by the workstation 100 or manually by the operator using the workstation 100. The designated repair region 108 preferably not only includes the cut 106 but also adjacent regions 110 and 112 of the conductive path 104.

As seen in enlargement B, a conductive ink, such as a nanoparticle silver ink, a nanoparticle copper ink, or a non-metal conductive ink, for example, a carbon nanotube ink, is deposited over a region 114, extending beyond the designated repair region 108 and also covering adjacent regions 116 and 118 of the conductive path 104 and regions 120 alongside the conductive path being repaired. The deposition of the conductive ink is preferably carried out by using a laser beam which impinges on a donor substrate, typically a transparent donor substrate, coated with the conductive ink. The laser beam is typically produced by a short pulse, nanosecond pulsed laser with emission in the UV, Visible or NIR range, such as a microchip laser commercially available from Teem Photonics, Meylan, France. Alternatively, the conductive ink is deposited onto the repair location using an inkjet printer head or a dispensing tool for deposition of such ink locally on a substrate. The conductive ink is then dried, preferably by use of a suitable blower or by laser heating thereof.

Nanoparticle silver inks are commercially available from Sun Chemical Corp., Parsippany, N.J., USA, E.I. Du Pont De Nemours and Co., Wilmington, Del., USA, Amepox Microelectronics Ltd. of Lodz, Poland, Kunshan Hisense Electronics Co, Ltd of Jiangsu Province, China, and PV Nano Cell, Ltd. of Migdal Ha'Emek, Israel. Nanoparticle copper ink is commercially available from Intrinsiq Materials Inc. of Rochester, N.Y., USA. Carbon nanotube inks are commercially available from Brewer Science of Rolla, Mo., USA.

Preferably, the deposited layer has a thickness in the range of 0.1 to 5 microns and includes conductive particles having a diameter in the range of 10-100 nanometers.

As seen in enlargement C, as distinguished from the embodiments of FIGS. 1A-1B, laser trimming is preferably carried out to remove conductive ink from regions 120 alongside the conductive path being repaired. This provides relatively high resolution repaired conductive path edge definition, preferably providing edge definition accuracy and uniformity below one micron.

As seen in enlargement D, laser sintering is preferably carried out in the remaining part of designated repair region 108 and as seen in enlargement E, further laser trimming is preferably carried out along the periphery thereof, thus removing unsintered conductive ink from regions 116 and 118. Preferably, but not necessarily, laser trimming may be carried out using the same laser employed for deposit of the conductive ink.

It is a particular feature of the present invention that laser trimming and removal of unsintered conductive ink from regions 116 and 118 overlying the conductive path 104 is achieved without damaging the conductive path by the use of a pulsed laser at a pulse length of between 10 psec to 100 nsec and more particularly between 100 psec and 10 nsec and a pulse energy fluence of between 1 to 500 miliJoule/cm$^2$, and more particularly between 30 to 100 miliJoule/cm$^2$.

In an alternative preferred embodiment of the present invention, unsintered conductive ink may be removed from regions 116 and 118 overlying the conductive path 104 without damaging the conductive path by washing the substrate with a suitable solvent. Suitable solvents include water, ethanol, iso-propanol, cyclohexanol or other aliphatic alcohols, acetone, methyl ethyl ketone, cyclohaxanone or other ketones, glycol ethers and glycols ether acetates. Additionally, additives such as surfactants and chelating agents may be added to enhance the process. Such surfactants and chelating agents are commercially available from suppliers, such as Sigma-Aldrich Corporation of St Louis, Mo., USA and Tokyo Chemical Industry Co Ltd of Tokyo, Japan, or manufacturers, such as Dow Chemical Company of Midland, Mich., USA. This alternative embodiment is particularly useful when the conductive ink is deposited onto the repair location using an inkjet printer head or a dispensing tool for deposition of such ink locally on a substrate, which may result in a large area of unsintered ink.

Figure 3A:
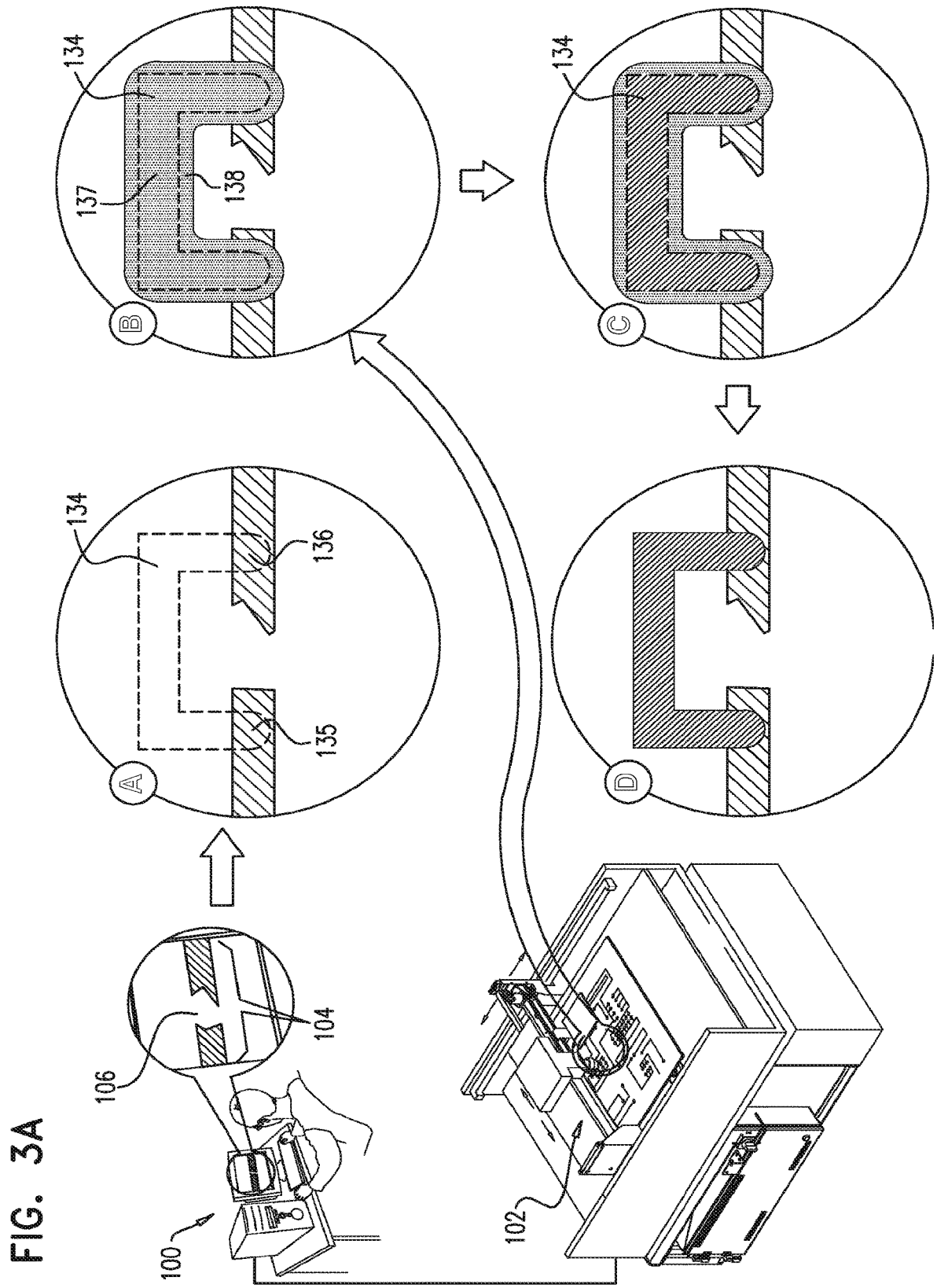
FIG. 3A is a simplified illustration of the operation of a system and method for producing a conductive path on a substrate in accordance with yet another preferred embodiment of the present invention.

Reference is now made to FIG. 3A, which is a simplified illustration of the operation of a system and method for producing a conductive path on a substrate in accordance with yet another preferred embodiment of the present invention. Here, as distinguished from the embodiments of FIGS. 1A-2, a bypass conductive path is generated. This is particularly useful when there exist circuit elements, such as a conductor in a cross direction underneath the conductor to be repaired, in the vicinity of a cut 106 in a conductive path 104.

It is appreciated that the functionality of FIG. 3A may be employed both inside and outside of the repair context for writing with ink from a donor substrate onto a substrate in a desired pattern. This may be used, for example, for depositing highly conductive materials in relatively large regions, as for making large repairs on a substrate.

As seen in FIG. 3A, a visual inspection is carried out by an operator using a workstation 100, coupled to a conductive path generator 102, which will be described hereinbelow with respect to FIG. 4.

The operator typically sees a portion of a conductive path 104 having a cut 106 therein and indicates a designated bypass region 134, as seen in enlargement A, which may be drawn automatically by the workstation 100 or manually by the operator using the workstation 100. The designated bypass region 134 includes regions 135 and 136 which overlap portions of the conductive path 104.

As seen in enlargement B, a conductive ink, such as a nanoparticle silver ink, a nanoparticle copper ink, or a non-metal conductive ink, for example, a carbon nanotube ink, is deposited over a region 137, extending beyond the designated bypass region 134 and also covering adjacent regions 138 along and outside the peripheral edges of designated bypass region 134. The deposition of the conductive ink is preferably carried out by using a laser beam which impinges on a donor substrate, typically a transparent donor substrate, coated with the conductive ink. The laser beam is typically produced by a short pulse, nanosecond pulsed laser with emission in the UV, Visible or NIR range, such as a microchip laser commercially available from Teem Photonics, Meylan, France. Alternatively, the conductive ink is deposited onto the repair location using an inkjet printer head or a dispensing tool for deposition of such ink locally on a substrate. The conductive ink is then dried, preferably by use of a suitable blower or by laser heating thereof.

Nanoparticle silver inks are commercially available from Sun Chemical Corp., Parsippany, N.J., USA, E.I. Du Pont De Nemours and Co., Wilmington, Del., USA, Amepox Microelectronics Ltd. of Lodz, Poland, Kunshan Hisense Electronics Co, Ltd of Jiangsu Province, China, and PV Nano Cell, Ltd. of Migdal Ha'Emek, Israel. Nanoparticle copper ink is commercially available from Intrinsiq Materials Inc. of Rochester, N.Y., USA. Carbon nanotube inks are commercially available from Brewer Science of Rolla, Mo., USA.

Preferably, the deposited layer has a thickness in the range of 0.1 to 5 microns and includes conductive particles having a diameter in the range of 10-100 nanometers.

As seen in enlargement C, laser sintering is preferably carried out in the designated bypass region 134 and as seen in enlargement D, laser trimming is preferably carried out along the periphery thereof, thus removing unsintered conductive ink from regions 138. Preferably, but not necessarily, laser trimming may be carried out using the same laser employed for deposit of the conductive ink.

It is a particular feature of the present invention that laser trimming and removal of unsintered conductive ink from regions 138 overlying the conductive path 104 is achieved without damaging the conductive path by the use of a pulsed laser at a pulse length of between 10 psec to 100 nsec and more particularly between 100 psec and 10 nsec, and a pulse energy fluence of between 1 to 500 miliJoule/cm$^2$, and more particularly between 30 to 100 miliJoule/cm$^2$.

In an alternative preferred embodiment of the present invention, unsintered conductive ink may be removed from regions 138 overlying the conductive path 104 without damaging the conductive path by washing the substrate with a suitable solvent. Suitable solvents include water, ethanol, iso-propanol, cyclohexanol or other aliphatic alcohols, acetone, methyl ethyl ketone, cyclohaxanone or other ketones, glycol ethers and glycols ether acetates. Additionally, additives such as surfactants and chelating agents may be added to enhance the process. Such surfactants and chelating agents are commercially available from suppliers, such as Sigma-Aldrich Corporation of St Louis, Mo., USA and Tokyo Chemical Industry Co Ltd of Tokyo, Japan, or manufacturers, such as Dow Chemical Company of Midland, Mich., USA. This alternative embodiment is particularly useful when the conductive ink is deposited onto the repair location using an inkjet printer head or a dispensing tool for deposition of such ink locally on a substrate, which may result in a large area of unsintered ink.

Figure 3B:
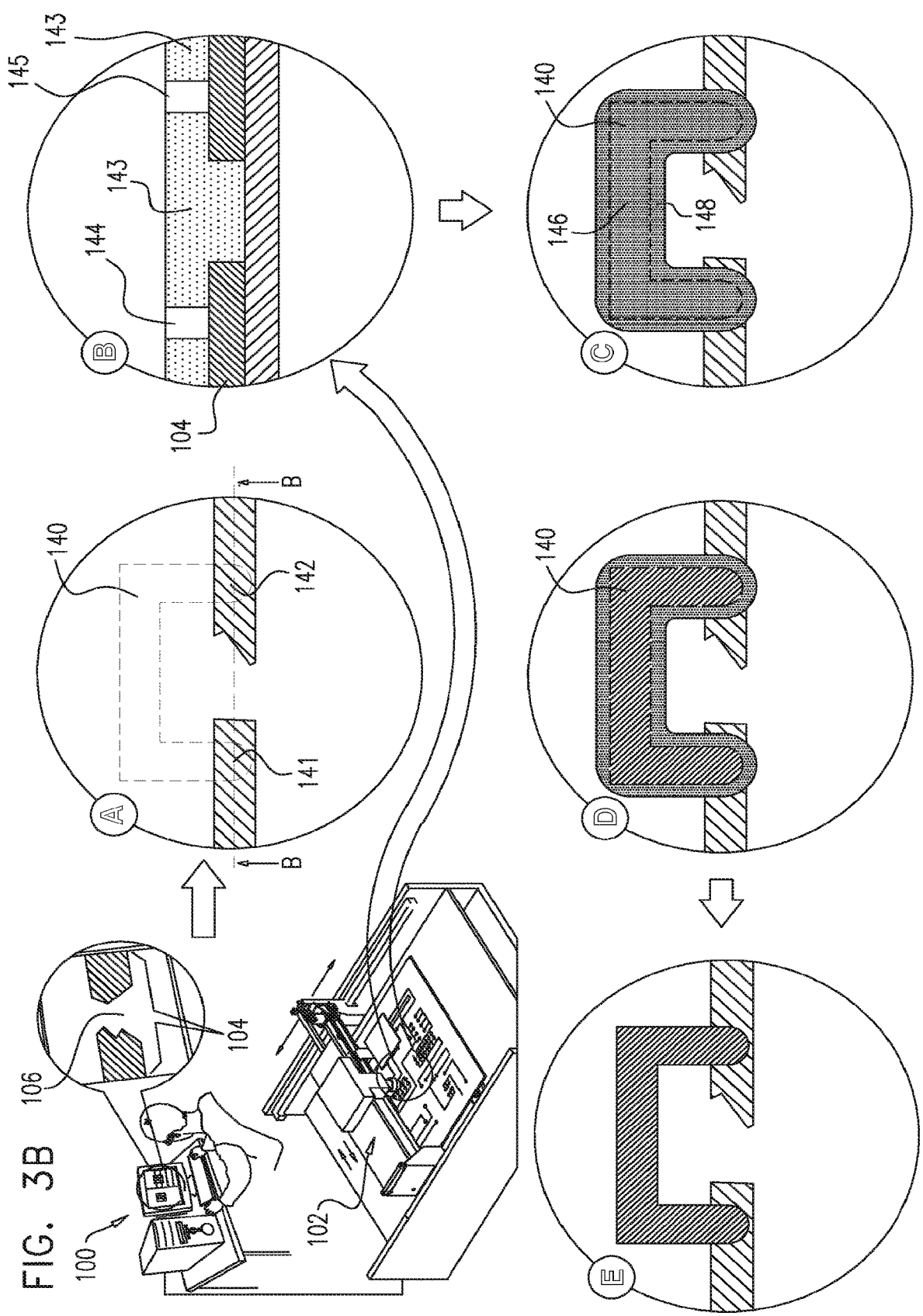
FIG. 3B is a simplified illustration of the operation of a system and method for producing a conductive path on a substrate in accordance with still another preferred embodiment of the present invention.

Reference is now made to FIG. 3B, which is a simplified illustration of the operation of a system and method for producing a conductive path on a substrate in accordance with yet another preferred embodiment of the present invention. Here, as distinguished from the embodiment of FIG. 3A, conductor 104 and some or all of the substrate have been covered by an additional non-conductive layer and a bypass conductive path is generated above the additional non-conductive layer.

As seen in FIG. 3B, a visual inspection is carried out by an operator using a workstation 100, coupled to a conductive path generator 102, which will be described hereinbelow with respect to FIG. 4.

The operator typically sees a portion of a conductive path 104 having a cut 106 therein and indicates a designated bypass region 140, as seen in enlargement A, which may be drawn automatically by the workstation 100 or manually by the operator using the workstation 100. The designated bypass region 140 includes regions 141 and 142 which overlap portions of the conductive path 104. As seen particularly in enlargement B, conductive path 104 is covered by a non-conductive layer 143, which typically also covers some or all of the rest of the substrate.

As seen further in enlargement B, laser ablation of areas of non-conductive layer 143 from a portion of regions 141 and 142, here designated by reference numbers 144 and 145, overlying conductive path 104 is performed, typically using a pulsed laser at a pulse length of between 10 psec to 100 nsec and more particularly between 100 psec and 10 nsec, and a pulse energy fluence of between 100 to 1500 miliJoule/cm$^2$, and more particularly between 300 to 1000 miliJoule/cm$^2$.

As seen in enlargement C, a conductive ink, such as a nanoparticle silver ink, a nanoparticle copper ink, or a non-metal conductive ink, for example, a carbon nanotube ink, is deposited over a region 146, extending beyond the designated bypass region 140 and also covering adjacent regions 148 along and outside the peripheral edges of designated bypass region 140. The conductive ink is also deposited into areas 144 and 145, thereby forming a conductive connection from conductive path 104 to bypass region 140.

The deposition of the conductive ink is preferably carried out by using a laser beam which impinges on a donor substrate, typically a transparent donor substrate, coated with the conductive ink. The laser beam is typically produced by a short pulse, nanosecond pulsed laser with emission in the UV, Visible or NIR range, such as a microchip laser commercially available from Teem Photonics, Meylan, France. Alternatively, the conductive ink is deposited onto the repair location using an inkjet printer head or a dispensing tool for deposition of such ink locally on a substrate. The conductive ink is then dried, preferably by use of a suitable blower or by laser heating thereof.

Nanoparticle silver inks are commercially available from Sun Chemical Corp., Parsippany, N.J., USA, E.I. Du Pont De Nemours and Co., Wilmington, Del., USA, Amepox Microelectronics Ltd. of Lodz, Poland, Kunshan Hisense Electronics Co, Ltd of Jiangsu Province, China, and PV Nano Cell, Ltd. of Migdal Ha'Emek, Israel. Nanoparticle copper ink is commercially available from Intrinsiq Materials Inc. of Rochester, N.Y., USA. Carbon nanotube inks are commercially available from Brewer Science of Rolla, Mo., USA.

Preferably, the deposited layer has a thickness in the range of 0.1 to 5 microns and includes conductive particles having a diameter in the range of 10-100 nanometers.

As seen in enlargement D, laser sintering is preferably carried out in the designated bypass region 140 and as seen in enlargement E, laser trimming is preferably carried out along the periphery thereof, thus removing unsintered conductive ink from regions 148. Preferably, but not necessarily, laser trimming may be carried out using the same laser employed for deposit of the conductive ink.

It is a particular feature of the present invention that laser trimming and removal of unsintered conductive ink from regions 148 overlying the conductive path 104 is achieved without damaging the conductive path by the use of a pulsed laser at a pulse length of between 10 psec to 100 nsec and more particularly between 100 psec and 10 nsec, and a pulse energy fluence of between 1 to 500 miliJoule/$cm^2$, and more particularly between 30 to 100 miliJoule/$cm^2$.

In an alternative preferred embodiment of the present invention, unsintered conductive ink may be removed from regions 148 overlying the conductive path 104 without damaging the conductive path by washing the substrate with a suitable solvent. Suitable solvents include water, ethanol, iso-propanol, cyclohexanol or other aliphatic alcohols, acetone, methyl ethyl ketone, cyclohaxanone or other ketones, glycol ethers and glycols ether acetates. Additionally, additives such as surfactants and chelating agents may be added to enhance the process. Such surfactants and chelating agents are commercially available from suppliers, such as Sigma-Aldrich Corporation of St Louis, Mo., USA and Tokyo Chemical Industry Co Ltd of Tokyo, Japan, or manufacturers, such as Dow Chemical Company of Midland, Mich., USA. This alternative embodiment is particularly useful when the conductive ink is deposited onto the repair location using an inkjet printer head or a dispensing tool for deposition of such ink locally on a substrate, which may result in a large area of unsintered ink.

Figure 4:
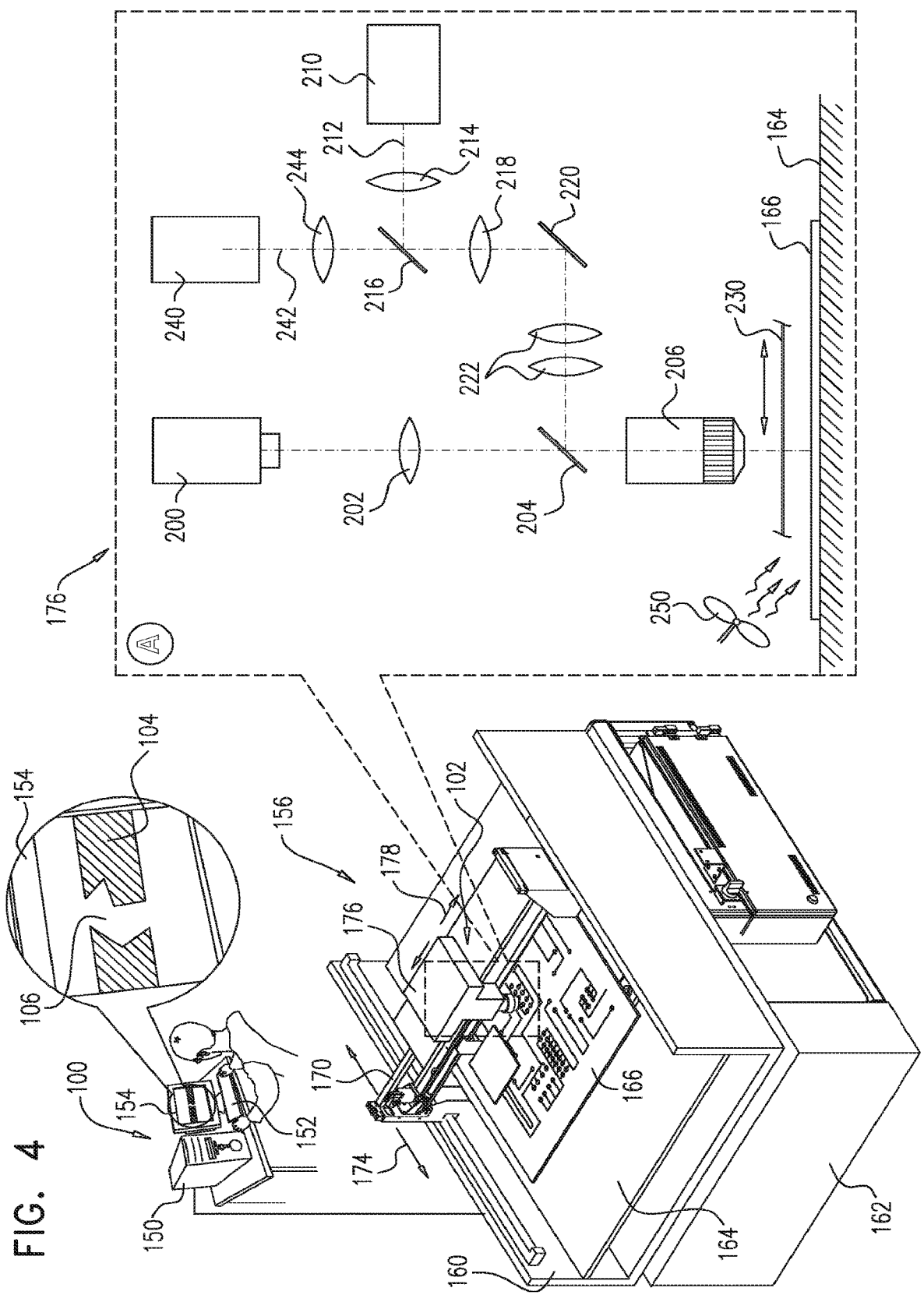
FIG. 4 is a simplified illustration of a system for carrying out the methodologies of FIGS. 1A-3B.

Reference is now made to FIG. 4, which is a simplified illustration of a system for carrying out the methodologies of FIGS. 1A-3B.

As seen in FIG. 4, the system preferably includes workstation 100 and conductive path generator 102. Workstation 100 preferably includes a computer 150, including a user input interface 152 and a display 154.

Conductive path generator 102 preferably comprises a substrate positioning assembly 156 including a chassis 160, which is preferably mounted on a conventional optical table 162. The chassis 160 defines a substrate inspection location 164 onto which a substrate 166, typically an electrical circuit, such as a printed circuit board (PCB) or flat panel display (FPD), to be inspected and/or repaired, may be placed. Substrate 166 typically has one or more of various types of defects, such as missing conductor defects, for example cut 106.

Substrate positioning assembly 156 also preferably includes a bridge 170 arranged for linear motion relative to inspection location 164 along a first inspection axis 174 defined with respect to chassis 160.

Preferably, conductive path generator 102 also comprises an optical assembly 176, preferably arranged for linear motion relative to bridge 170 along a second inspection axis 178, perpendicular to first inspection axis 174. Alternatively, the optical assembly 176 may be a stationary optical assembly and chassis 160 may be a moveable chassis operative to provide X and Y movement of substrate 166 relative to optical assembly 176.

Workstation 100 preferably also includes software modules operative to operate optical assembly 176 and substrate positioning assembly 156. Workstation 100 preferably receives a defect location input from an automatic optical inspection system, not shown, such as a Discovery™ 8000 system or a Supervision™ system, both commercially available from Orbotech Ltd. of Yavne, Israel.

As seen in enlargement A, which is a schematic block diagram of optical assembly 176, optical assembly 176 preferably includes a camera 200, which views the substrate 166, preferably via a lens assembly 202, a beam combiner 204 and an objective lens assembly 206, and provides an operator sensible image of conductive paths 104 on display 154.

Optical assembly 176 also preferably includes a pulsed laser 210, typically a short pulse, nanosecond pulsed laser with emission in the UV, Visible or NIR range, such as a microchip laser commercially available from Teem Photonics, Meylan, France, which emits a laser beam 212 which passes through a lens assembly 214, a beam combiner 216 and a further lens assembly 218 and impinges on a fast scanning mirror 220, which directs it via a relay optical assembly 222 and is reflected by beam combiner 204 via objective lens assembly 206. Laser beam 212 then impinges on a selectably positionable conductive ink donor substrate 230 to deposit conductive ink onto substrate 166. It is appreciated that pulsed laser 210 is preferably operative during the conductive ink deposition and laser trimming stages described hereinabove.

Optical assembly 176 also preferably includes a continuous wave laser 240, typically a high power, single mode, diode laser emitting in near UV, visible or Near IR, such as a GaN 405 nm DL, commercially available from Nichia Corporation of Tokushima, Japan, a Red/Near IR emitting LD, commercially available from Blue Sky Research, Milpitas, Calif., USA, a Cobolt 05-01 series CW DPSS laser from Cobolt AB Stockholm, Sweden, Spectra-Physics Excelsior series CW DPSS lasers, commercially available from Newport Corporation of Irvine Ca, USA, or any other suitable high power continuous wave laser, which emits a laser beam 242 which passes through a lens assembly 244, beam combiner 216 and further lens assembly 218 and impinges on fast scanning mirror 220, which directs it via relay optical assembly 222 and is reflected by beam combiner via objective lens assembly 206 onto substrate 166. It is appreciated that continuous wave laser 240 is preferably operative during the laser sintering stage described hereinabove.

Preferably, continuous wave laser 240 operates at a power level between 40-100 mW, a scan speed between 0.5-10 mm/sec, more preferably between 1-3 mm/sec and a spot size of 2-10 microns.

It is appreciated that selectably positionable conductive ink donor substrate is selectably positionable for positioning in the optical path of laser beam 212, for deposition of conductive ink on substrate 166 during the conductive ink deposition stage described hereinabove, and outside of the optical path of objective lens assembly 206, during the imaging, laser trimming and laser sintering stages described hereinabove.

Preferably, a blower 250 is provided adjacent an impingement location on substrate 166 of conductive ink from donor substrate 230, for quick drying of the conductive ink.

It will be appreciated by persons skilled in the art that the present invention is not limited by what has been particularly shown and described hereinabove. Rather the scope of the present invention is defined by the claims which follow and include variations and modifications which would occur to persons skilled in the art upon reading the foregoing and which are not in the prior art.

The invention claimed is:

1. A system for producing a conductive path on a substrate comprising:
   an optical assembly including:
      a patterning laser, operative to generate a patterning laser beam; and
      an ablating laser, operative to generate an ablating laser beam; and
   a substrate positioning assembly, movable relative to said optical assembly, operative to position said optical assembly relative to a substrate,
   a camera in electronic communication with a workstation, wherein said workstation is configured to:
      identify a cut between two ends of said conductive path,
      send instructions to deposit a layer of material such that said layer of material is in contact with said two ends of said conductive path, and
      send instructions to selectably sinter regions of said layer of material thereby causing said metal particles to together define a conductor at sintered regions between said two ends of said conductive path,
   said patterning laser beam being operative to selectably sinter regions of said layer of material having a thickness in a range of 0.1 to 5 microns, including metal particles having a diameter in a range of 10 to 100 nanometers, deposited on said substrate, thereby causing said metal particles to together define a conductor at sintered regions; and
   said ablating laser beam, being operative to deposit said layer of material and, below a threshold at which said sintered regions would be ablated, to ablate portions of said layer of material other than at said sintered regions.

2. The system for producing a conductive path on a substrate according to claim 1, wherein said substrate positioning assembly is moveable in both x and y directions relative to said optical assembly.

3. The system for producing a conductive path on a substrate according to claim 1, wherein said patterning laser is a continuous wave laser.

4. The system for producing a conductive path on a substrate according to claim 1, wherein said ablating laser is a pulsed laser.

5. The system for producing a conductive path on a substrate according to claim 1, further comprising a blower.

6. The system for producing a conductive path on a substrate according to claim 1, wherein said layer of material comprises conductive ink.

7. The system for producing a conductive path on a substrate according to claim 1, wherein said patterning laser beam is a continuous laser beam and has a power level between 40-100 mW.

8. The system for producing a conductive path on a substrate according to claim 1, wherein said workstation is configured to send instructions to:
   define at least two areas on said substrate forming part of said conductive path; and
   employ said ablating laser beam to ablate portions of a non-conductive layer formed over said substrate in said at least two areas.

9. The system for producing a conductive path on a substrate according to claim 6, wherein said layer of material is a nanoparticle silver ink, a nanoparticle copper ink, or a non-metal conductive ink.

* * * * *